United States Patent
Pasotti et al.

(10) Patent No.: US 9,613,692 B1
(45) Date of Patent: Apr. 4, 2017

(54) SENSE AMPLIFIER FOR NON-VOLATILE MEMORY DEVICES AND RELATED METHODS

(71) Applicants: STMICROELECTRONICS INTERNATIONAL N.V., Amsterdam (NL); STMICROELECTRONICS S.R.L., Agrate Brianza (IT)

(72) Inventors: Marco Pasotti, Travaco' Siccomario (IT); Marcella Carissimi, Treviolo (Bergamo) (IT); Rajat Kulshrestha, Noida (IN); Chantal Auricchio, Cassina de' Pecchi (IT)

(73) Assignees: STMICROELECTRONICS INTERNATIONAL N.V., Amsterdam (NL); STMICROELECTRONICS S.R.L., Agrate Brianza (MB) (IT)

( * ) Notice: Subject to any disclaimer, the term of this patent is extended or adjusted under 35 U.S.C. 154(b) by 0 days.

(21) Appl. No.: 14/971,488

(22) Filed: Dec. 16, 2015

(51) Int. Cl.
G11C 13/00 (2006.01)

(52) U.S. Cl.
CPC ........ *G11C 13/004* (2013.01); *G11C 13/0004* (2013.01); *G11C 13/0026* (2013.01); *G11C 2013/0042* (2013.01)

(58) Field of Classification Search
None
See application file for complete search history.

(56) References Cited

U.S. PATENT DOCUMENTS

| 7,342,819 B2* | 3/2008 | Liaw ........................ G11C 7/12 365/148 |
| 8,867,260 B2* | 10/2014 | Huang ................. G11C 13/004 365/148 |

OTHER PUBLICATIONS

Villa et al. ("A 45nm 1Gb 1.8V phase-change memory", Solid-State Circuits Conference Digest of Technical Papers (ISSCC), 2010 IEEE International, Issue Date: Feb. 7-11, 2010, provided in Mar. 21, 2016 IDS.*
Villa et al., A 45nm 1Gb 1.8V Phase-Change Memory, 2010 IEEE International Solid-State Circuits Conference, Digest of Technical Papers, ISSCC 2010/Session 14/Non-Volatile Memory/14.8, pp. 270-271.

* cited by examiner

Primary Examiner — James G Norman
(74) Attorney, Agent, or Firm — Slater Matsil, LLP

(57) ABSTRACT

A memory device includes an array of phase-change memory (PCM) cells and complementary PCM cells. A column decoder is coupled to the array of PCM cells and complementary PCM cells, and a sense amplifier is coupled to the column decoder. The sense amplifier includes a current integrator configured to receive first and second currents of a given PCM cell and complementary PCM cell, respectively. A current-to-voltage converter is coupled to the current integrator and is configured to receive the first and second currents, and to provide first and second voltages of the given PCM cell and complementary PCM cell to first and second nodes, respectively. A logic circuit is coupled to the first and second nodes and is configured to disable the column decoder and to discharge the bitline and complementary bitline voltages in response to the first and second voltages.

20 Claims, 4 Drawing Sheets

SENSE AMPLIFIER FOR NON-VOLATILE MEMORY DEVICES AND RELATED METHODS

TECHNICAL FIELD

The present invention relates to the field of memories, and, more particularly, to a sense amplifier for non-volatile memory devices and related methods.

BACKGROUND

Non-volatile phase-change memories (PCMs) incorporate materials that have the ability to switch between phases having different electrical characteristics. For example, these materials can switch between a disorderly amorphous phase and an orderly crystalline or polycrystalline phase, and the two phases are associated with resistivities of considerably different values, and consequently with a different value of a stored data. For example, the elements of Group VI of the periodic table, such as tellurium (Te), selenium (Se), or antimonium (Sb), referred to as chalcogenides or chalcogenic materials, can be advantageously used for manufacturing phase-change memory cells. The phase changes are obtained by increasing locally the temperature of the cells of chalcogenic material, through resistive electrodes (generally known as heaters) set in contact with respective regions of chalcogenic material. Selection devices (for example, MOSFETs), are connected to the heaters, and enable passage of a programming electrical current through a respective heater. The electrical current, by the Joule effect, generates the temperatures necessary for the phase change. During reading, the state of the chalcogenic material is detected by applying a voltage that is sufficiently low as not to cause a marked heating, and then by reading the value of the current that flows in the cell. Since the current is proportional to the conductivity of the chalcogenic material, it is possible to determine in which state the material is, and hence determine the data stored in the memory cells.

Non-volatile memories include an array of memory cells organized in rows (wordlines) and columns (bitlines). Each memory cell is formed, in the case of PCMs, by a phase-change memory element and by a selector transistor, connected in series. A column decoder and a row decoder, on the basis of logic address signals received at the input and more decoding schemes, enable selection of the memory cells, and in particular of the corresponding wordlines and bitlines.

The column decoder may include analog selection switches (comprised of transistors), which receive on their respective control terminals the address signals. The selection switches may be organized according to a tree structure in hierarchical levels, and their number in each hierarchical level is linked to the organization and to the size of the memory array. The selection switches, when enabled, allow the selected bitline to be brought to a definite value of voltage and/or current, according to the operations that it is desired to implement. In particular, a current path is created between a programming stage or a reading stage and the bitline selected. The current path is defined by the series of a certain number of selection switches, and is the same (within the memory array) both for the programming stage and for the reading stage. In particular, upstream of the current path, a selector is generally provided for associating the path alternatively with the programming stage or with the reading stage. Generally, the bitline-biasing voltages for reading operations are generated inside sense amplifiers used for reading the data in the reading stage, and the bitline-biasing voltages for writing operations are generated inside purposely provided programming drivers in the programming stage. The sense amplifiers carry out reading of the data stored in the memory cells by comparing the current that flows in the memory cell selected with a reference current that flows in a reference cell.

In the specific case of PCMs, in order to carry out a reading operation, voltages of a low value, for example between 300 mV and 600 mV, and currents of a standard value, for example in the region of 10-20 µA, are used. The voltages for carrying out writing are typically higher that the value for reading, for example, approximately 2 V higher than the voltage used for the reading operations. In addition, high currents, for example in the region of 600 µA, are used. In addition, a fast settling in the column coding is used during reading.

In PCM memories, sense amplifiers may include three stages. The first and second stages are typically differential stages, which serve as a current integrator and comparator, respectively. The third stage is a set-reset (SR) latch, which latches and converts a differential input into a single ended output. A shortcoming of this type of sense amplifier is that static current is always present in one of the arms of the comparator. In addition, relatively large precharge times are required, which leads to reduced throughput and longer access times.

Another example of an existing sense amplifier may include a differential I/V converter and a comparator, which is designed to bias the bit line directly from the supply voltage (VCC). The differential structure rejects read-while-write and supply noise occurring during the cell read operation. A bitline discharge-after-read feature may be implemented to reduce the error introduced by the wordline rise. For a multiple set cells pattern on the same wordline, the higher current injected in the selected wordline by the set cells increases the voltage, thereby affecting values of weak set cells and reset cells. Lowering the corresponding bitline after a set cell is detected may reduce this effect. However, a shortcoming of this type of sense amplifier is that the static current is cut only after the output is sampled by the flip-flop circuit at the end of the read cycle, thus, high current consumption is experienced until the output is sampled.

In addition, reliability is a prime concern for PCM cells for retention of correct data for a specified endurance cycle. The over voltages on the bitlines in existing sense amplifiers for long durations has a negative impact on endurance.

SUMMARY

A memory device inclues an array of phase-change memory (PCM) cells and complementary PCM cells, a column decoder coupled to the array of PCM cells and complementary PCM cells, a bitline coupled to the PCM cells, and a complementary bitline coupled to the complementary PCM cells. In addition, a sense amplifier is coupled to the column decoder. The sense amplifier includes a current integrator coupled to the first and second outputs and configured to receive first and second currents of a given PCM cell and complementary PCM cell, respectively. A current-to-voltage converter is coupled to the current integrator and configured to receive the first and second currents and to provide first and second voltages of the given PCM cell and complementary PCM cell to first and second nodes, respectively. A differential comparator may be coupled to the first and second nodes and configured to generate an output signal from the first and second voltages. A logic circuit may be coupled to the first and second nodes and configured to disable the column decoder and discharge the bitline and complementary bitline voltages in response to the first and second voltages, respectively.

In another embodiment, a method of using a sense amplifier for a memory device having an array of phase-change memory (PCM) cells and complementary PCM cells, a column decoder coupled to the array of PCM cells and complementary PCM cells, a bitline coupled to the PCM cells, and a complementary bitline coupled to the complementary PCM cells, is disclosed. The method includes converting first and second currents of a given PCM cell and complementary PCM cell, respectively, to first and second voltages, and disabling the column decoder and discharging the bitline and complementary bitline voltages based upon the first and second voltages.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
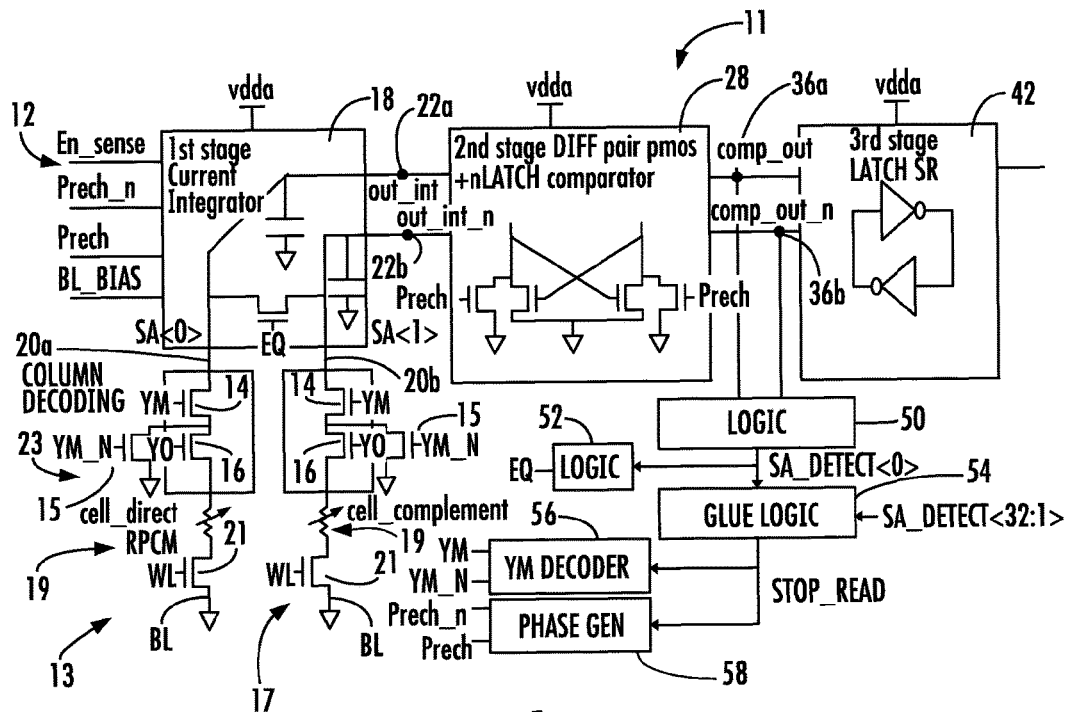
FIG. 1 is a block diagram of a portion of a non-volatile memory device, in particular of a PCM type, and of a corresponding sense amplifier, according to an embodiment of the invention.

In FIG. 1 a non-volatile memory device, in particular of a PCM type, designated as a whole by the reference number 11, is now described.

In particular, the non-volatile memory device includes memory cells, arranged according to wordlines WL and bitlines BL. Shown by way of example in FIG. 1 is a memory cell 13 and its complement memory cell 17. A common wordline WL and a bitline BL and its complement bit line BLn are coupled to the cell 13 and its complement 17, respectively. The memory cells 13 and 17, each include a phase-change element 19.

The phase-change element 19 includes a phase-change material, for example, a chalcogenide, and is able to store data in the form of resistance levels associated with the different phases assumed by the phase-change material. In FIG. 1, the phase-change element 19 is described as a resistor with variable resistance.

The selector element 21, in the embodiment illustrated, is an NMOS transistor having its gate terminal connected to the wordline WL, its drain terminal connected to the phase-change element 19, and its source terminal connected to a reference potential, for example, to ground. The selector element 21 is controlled so as to enable, when selected, the passage of a reading/programming current through the phase-change element 19 during respective reading/programming operations.

A column decoder 23 is coupled between the memory cell 13 and its complement 17, and a sense amplifier 12 and biasing circuit (not shown). The column decoder 23 is configured to generate a current path between the selected BL and the sense amplifier 12. The column decoder 23 may include two or levels of decoding. In this particular exemplary embodiment, selection switches 14 and 16, receive on their terminals respective column-decoding signals YM and YO. Switch 15 is controlled by the complement signal YM_N that is used for discharging BLs to ground. The selection switches 14, 15, and 16 may be low-voltage NMOS transistors.

The sense amplifier 12 includes a first stage 18 having nodes 22a and 22b. The first stage 18, which may be a current integrator, is coupled to the first output 20a and to the second output 20b. A second stage 28 having nodes 36a and 36b, which may be a current-to-voltage converter, is coupled to the first stage by the nodes 22a and 22b. A third stage 42, which may be an SR latch, may be coupled to the second stage 28 by the nodes 36a and 36b.

In addition, the sense amplifier 12 may include a logic circuit 50 coupled to the nodes 36a and 36b and to an equalizer circuit 52 and a glue logic circuit 54. The glue logic circuit 54 is coupled to a column decoder circuit 56 and a phase generator circuit 58.

Figure 2:
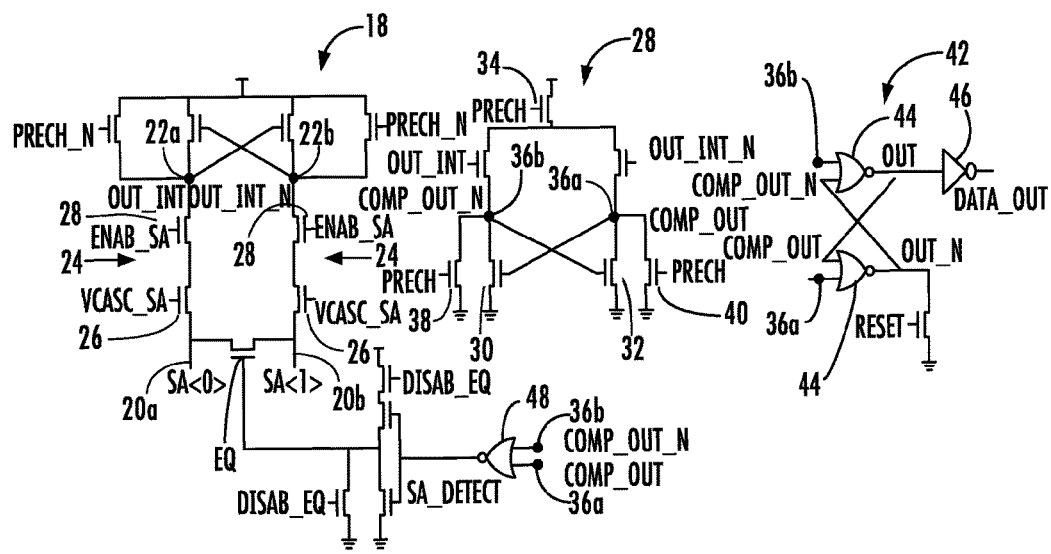
FIG. 2 is a schematic circuit diagram of the sense amplifier of FIG. 1.

Referring now FIG. 2, the architecture of the sense amplifier is now described. Although a single sense amplifier is shown, a bank of sense amplifiers, for example thirty-two sense amplifiers, may be coupled to the selected bit lines during a reading operation. As shown in FIG. 2, the sense amplifier 12 may comprise three stages and operate in four phases. For example, a read cycle may begin with a precharge phase, followed by an evaluation phase, which is followed by an equalization phase and a precharge phase for a next read cycle.

The first stage of the sense amplifier 12 may include respective cascode circuits 24. Each cascode circuit 24 has the function of biasing the drain terminal of the corresponding memory cell, 13 and 17, at a pre-set potential, and may be formed by a pair of NMOS transistors 26 and 28. In particular, the NMOS transistor 26 has its source terminal coupled to the corresponding outputs 20a and 20b, and its drain terminal coupled to the source terminal of transistor 28. The drain terminal of transistor 28 is coupled to the corresponding nodes 22a and 22b.

The sense amplifier 12 includes a second stage 28, which may be a current-to-voltage converter. The second stage 28 may include a current mirror formed by a first PMOS transistor 30 and a second PMOS transistor 32, which have their source terminals coupled to the nodes 36a and 36b, respectively, and to supply voltage Vdda through a PMOS transistor 34 which receives a control signal PRECH on its own gate terminal.

A pair of NMOS transistors 38 and 40 have gate terminals which receive the control signal PRECH, with source terminals set at a reference voltage, and drain terminals respectively coupled to the node 36*b* and the node 36*a*.

The sense amplifier also includes a third stage, which may be a differential comparator 42. The third stage 42 includes an SR latch comprising a pair of cross-coupled NOR gates 44 that are coupled to the node 36*a* and a second node 36*b*, respectively, and on which there are respectively present a first voltage COMP_OUT and a second voltage COMP_OUT_N correlated to the current flowing in the two memory cells 13 and 17, during reading. A NOT gate 46 is coupled to the pair of NOR gates 44 and provides an output signal DATA_OUT.

In operation, the first stage 18 sums up the current on the node 22*a* OUT_INT and 22*b* OUT_INT_N during a precharge phase and the node voltages are settled. The first stage 18 also provides statically polarization of the bitlines BL of approximately 0.6V through Vcasc_sa.

When the precharge phase is terminated, the signal may develop on the nodes 22*a* and 22*b* as OUT_INT and OUT_INT_N, respectively, as the integral of the current difference from the cell 13 and its complement cell 17. When the voltage of these two nodes 22*a* and 22*b* is low enough to turn on the cross coupled PMOS of the second stage current-to-voltage converter 28, it is amplified by their positive feedback and the third stage differential comparator 42 can begin to develop its decision. One of the two nodes 36*a* COMP_OUT and 36*b* COMP_OUT_N will rise setting the correct data in the NOR-based SR flip-flop 42.

Correspondingly, at the rise of one of the two signals COMP_OUT and COMP_OUT_N, an equalization signal EQ and a signal STOP_READ is generated to remove the differential signal from the two bitlines BL and to avoid bitline voltages rising and then preparing the bitlines BL for the next read operation. When all the equalization signals are on, the read operation is concluded by the STOP_READ changing to "1", and the precharge signal is asserted to restore the initial condition in the sense amplifier 12. The current paths to the bitlines BL may be closed thereby deselecting YM transistors (one level of decoding) to avoid unnecessary current consumption and the bitlines BL are grounded.

After the precharge phase, where PRECH changes from "1" to "0", one of the COMP_OUT and COMP_OUT_N changes its state from "0" to "1" depending upon currents in each arm (i.e., 30 and 32) of the current-to-voltage converter 28. In turn, SA_DETECT changes its state from "1" to "0". The SA_DETECT signal then enables the EQ signal, which marks the equalization phase.

Figure 3:
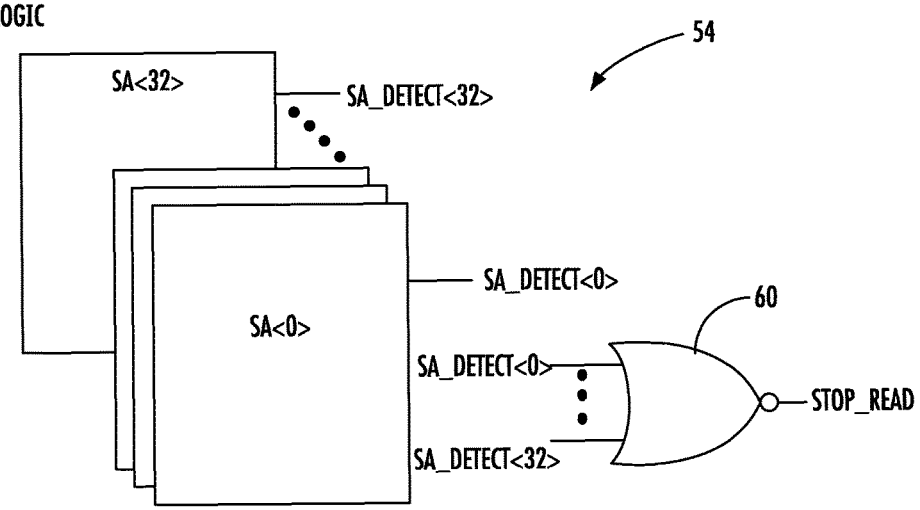
FIG. 3 is schematic of a circuit diagram and logic for a generation of a STOP_READ signal in accordance with the present invention.

Referring now to FIG. 3, the glue logic circuit 54 is configured so that a STOP_READ signal changes from "0" to "1", when the signals corresponding to SA_DETECT <32:0> change from "1" to "0" using a NOR gate 60.

Figure 4:
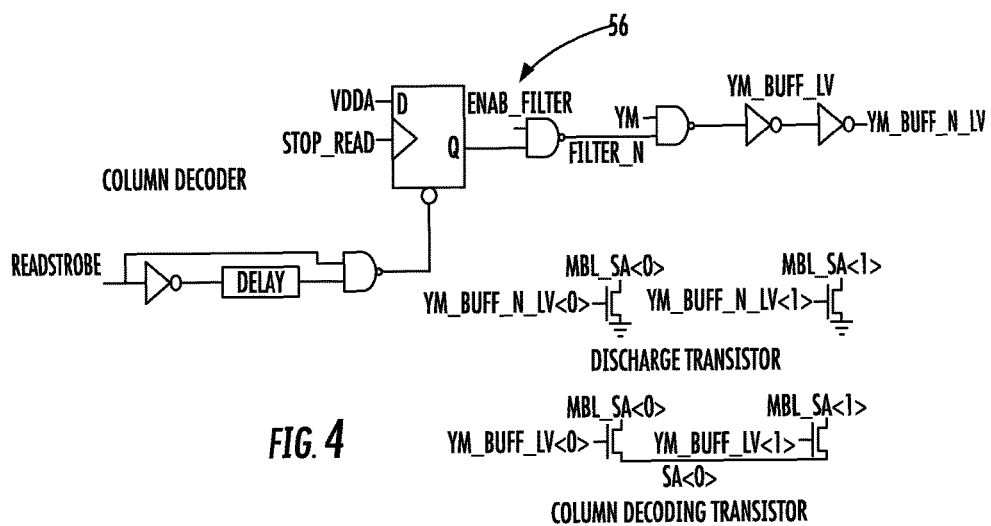
FIG. 4 is a schematic circuit diagram of a column decoder in accordance with the present invention.

Referring now to FIG. 4, the column decoder 56 is now described. On the positive edge of the STOP_READ signal (i.e. "0" to "1"), FILTER_N transitions from "1" to "0", thereby turning off YM decoding. This effectively cuts the static current path from VDD to ground through the phase change element 19 and the sense amplifier 12. Disabling of the YM decoding (YM_BUFF_N_LV="1") also discharges the bitline voltages to ground. A READSTROBE signal resets the FF to enable FILTER_N on the onset of the next read/verify operation.

Figure 5:
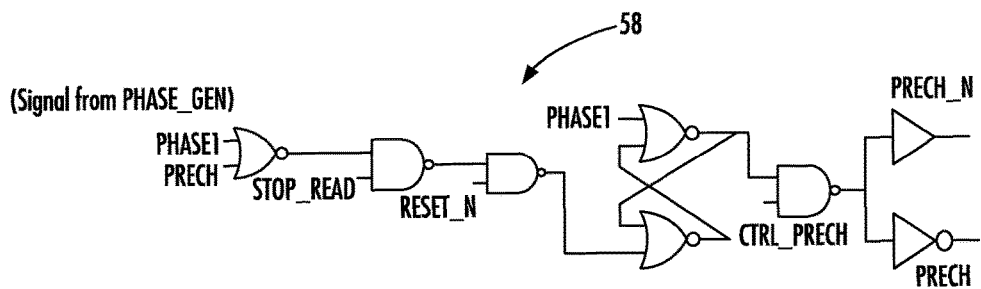
FIG. 5 is a schematic circuit diagram of a circuit to generate a PRECH signal during a precharge phase in accordance with the present invention.

Referring now to FIG. 5, during the evaluation phase before the output signal is generated, PHASE1 (signal from the phase generator 58) and PRECH are "0". Hence, PRECH and PRECH_N retain their value as long as STOP_READ="0". When STOP_READ transitions from "0" to "1", the SR latch is reset and thus PRECH transitions to "1", thereby precharging the OUT_INT and OUT_INT_N nodes 22*a* and 22*b* of the current integrator 18 to Vdda.

Figure 6:
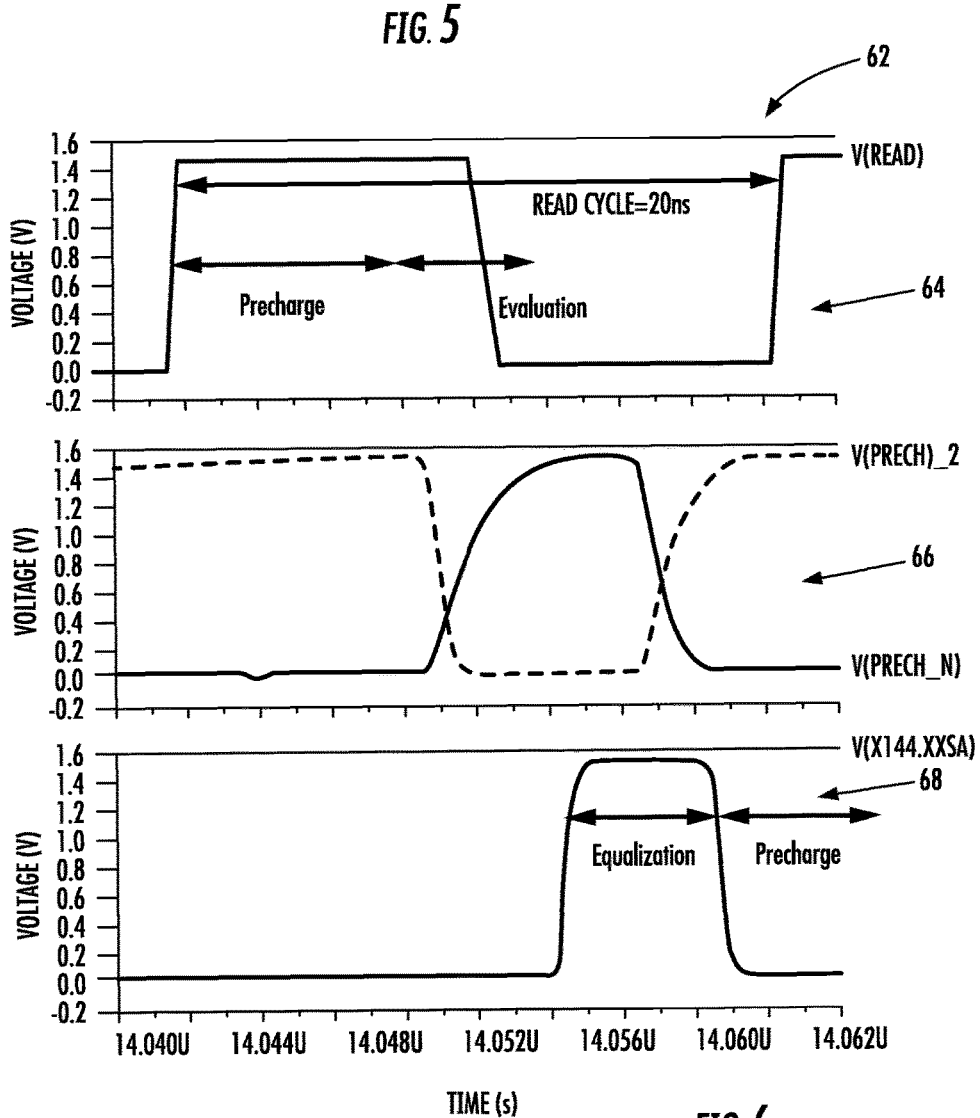
FIG. 6 shows a timing of voltage levels in three stages of the sense amplifier in accordance with the present invention.

FIG. 6 is a stage timing chart 62 of voltage levels in the three stages of the sense amplifier 12. For example, a current integrator timing chart 62, a current-to-voltage converter timing chart 64, and a differential comparator timing chart 66, describe the voltage levels in each stage during a read cycle. Each read cycle is divided into two main phases comprising a precharge phase and evaluation phase, followed by an equalization phase and precharge phase for the next read cycle.

Figure 7:
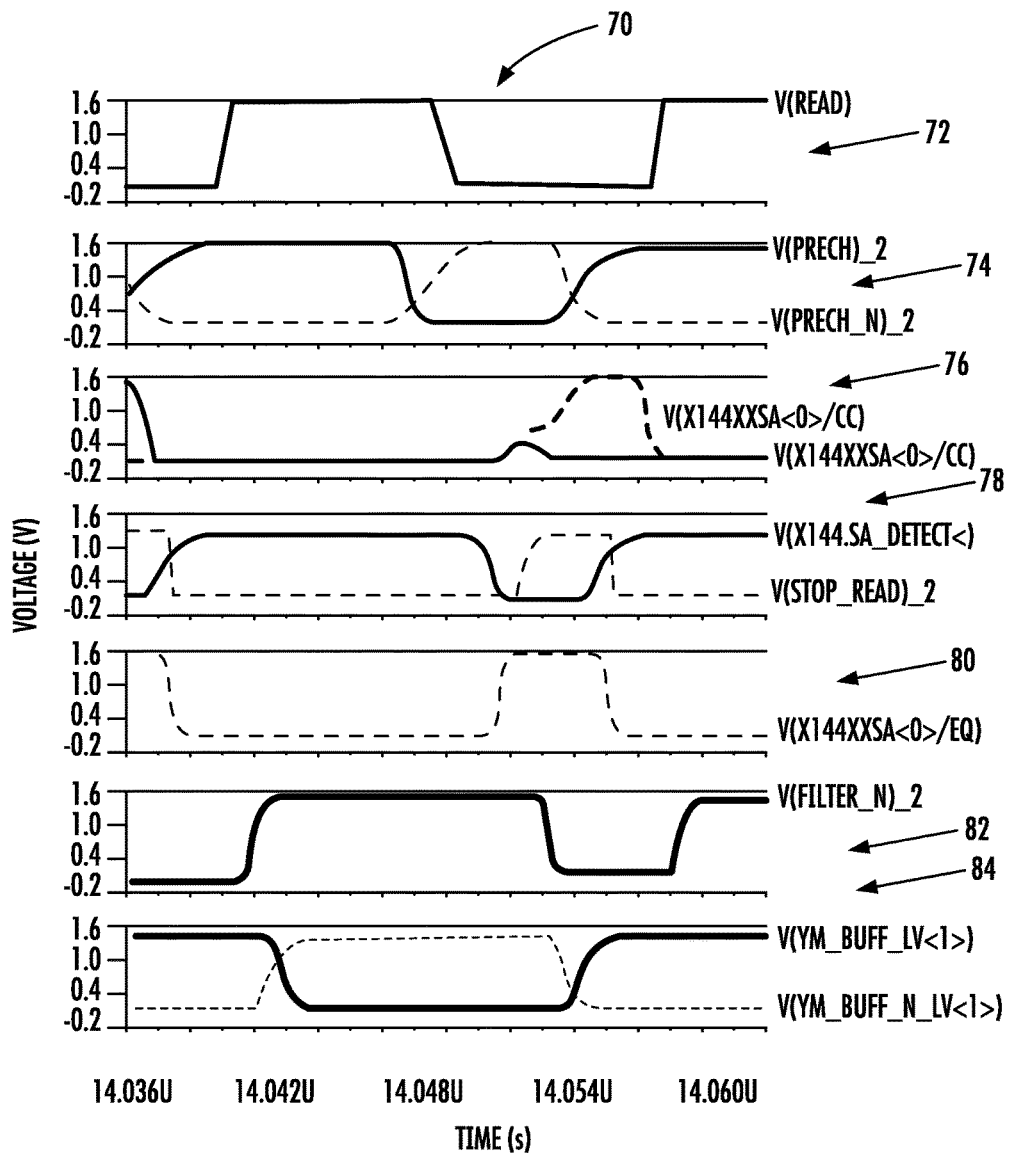
FIG. 7 shows a timing of voltages levels of the sense amplifier during the read cycle in accordance with the present invention.

FIG. 7 is a signal timing chart 70 of voltage levels of the various signals described above. For example, a READ timing chart 72, a PRECH and PRECH_N timing chart 74, a COMP_OUT and COMP_OUT_N timing chart 76, a SA_DETECT<0> and STOP_READ timing chart 78, a EQ timing chart 80, a FILTER_N timing chart 82, and a YM_BUFF_LV and YM_BUFF_LV_N timing chart 84, show the timing of each of the signals relative to one another and corresponding voltage levels.

In another embodiment, a method of using a sense amplifier for a phase-change non-volatile memory device is disclosed where the memory device includes at least a memory cell and complementary memory cell, a corresponding bitline and complementary bitline coupled thereto, and a column decoder coupled to the memory cell and the complementary memory cell. The method includes receiving first and second currents of the memory cell and the complementary memory cell, respectively, and converting the first and second currents to first and second voltages of the memory cell. The method also includes generating an output signal from the first and second voltages, and disabling the column decoder and discharging bitline voltages in response to the first and second voltages.

Advantages of the present invention include reduced power consumption in read and verify operations. During the evaluation phase, consumption from Vdda may be close to zero after the output signal is generated due to YM disabling. In existing memory devices, static current is always there in one arm of the mirror balancing circuit of the current-to-voltage converter. Other voltages on the bitlines may also be removed and discharged to ground in response to the output is generated by disabling YM decoding and thereby enhancing reliability. In addition, increased throughput is realized by the differential signal removal through the equalization phase.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A memory device comprising:
   an array of phase-change memory (PCM) cells and complementary PCM cells;
   a column decoder coupled to the array of PCM cells and complementary PCM cells and having first and second outputs;
   a bitline coupled to the PCM cells;
   a complementary bitline coupled to the complementary PCM cells; and
   a sense amplifier coupled to the column decoder and comprising a current integrator coupled to the first and second outputs and configured to receive first and second currents of a given PCM cell and complementary PCM cell, respectively, a current-to-voltage converter coupled to the current integrator and configured to receive the first and second currents and to provide first and second voltages of the given PCM cell and complementary PCM cell to first and second nodes, respectively, a differential comparator coupled to the first and second nodes and configured to generate an output signal from the first and second voltages; and a logic circuit directly coupled to the first and second nodes and configured to disable the column decoder and discharge the bitline and complementary bitline voltages in response to the first and second voltages, respectively.

2. The memory device of claim 1, wherein the current integrator comprises an equalization transistor coupled between the bitline and the complementary bitline to selectively establish a connection between the bitline and the complementary bitline during an equalization phase.

3. The memory device of claim 1, further comprising a read circuit coupled to the differential comparator.

4. The memory device of claim 1, wherein the sense amplifier is configured to perform a precharge operation and a voltage equalization operation after each read cycle.

5. The memory device of claim 1, wherein each PCM cell and respective complementary PCM cell comprises a phase change region, and a selector transistor coupled thereto.

6. The memory device of claim 2, wherein an output of the differential comparator is configured to generate a detect logic signal that enables switching to the equalization phase.

7. The memory device of claim 2, further comprising a pre-charge circuit configured to charge the bitline and complementary bitline to a supply voltage during a pre-charge phase.

8. A sense amplifier coupled to an array of phase-change memory (PCM) cells and complementary PCM cells, and having a bitline and a complementary bitline coupled to the PCM cells and the complementary PCM cells, respectively, the sense amplifier comprising:

a current integrator coupled to the first and second outputs and configured to receive first and second currents of a given PCM cell and complementary PCM cell, respectively, a current-to-voltage converter coupled to the current integrator and configured to receive the first and second currents and to provide first and second voltages of the given PCM cell and complementary PCM cell to first and second nodes, respectively, a differential comparator coupled to the first and second nodes and configured to generate an output signal from the first and second voltages; and a logic circuit directly coupled to the first and second nodes and configured to disable the column decoder and to discharge the bitline and complementary bitline voltages in response to the first and second voltages, respectively.

9. The sense amplifier of claim 8, wherein the current integrator comprises an equalization transistor coupled between the bitline and the complementary bitline to selectively establish a connection between the bitline and the complementary bitline during an equalization phase.

10. The sense amplifier of claim 8, further comprising a read circuit coupled to the differential comparator.

11. The sense amplifier of claim 8, wherein the sense amplifier is configured to perform a precharge operation and a voltage equalization operation after each read cycle.

12. The sense amplifier of claim 8, wherein each PCM cell and respective complementary PCM cell comprises a phase change region, and a selector transistor coupled thereto.

13. The sense amplifier of claim 9, wherein an output of the differential comparator is configured to generate a detect logic signal that enables switching to the equalization phase.

14. The sense amplifier of claim 8, further comprising a pre-charge circuit configured to charge the bitline and complementary bitline to a supply voltage during a pre-charge phase.

15. A method of using a sense amplifier for a memory device comprising an array of phase-change memory (PCM) cells and complementary PCM cells, a column decoder coupled to the array of PCM cells and complementary PCM cells, a bitline coupled to the PCM cells, a complementary bitline coupled to the complementary PCM cells, a current integrator coupled to the column decoder, a current-to-voltage converter coupled to the current integrator, and a logic circuit directly coupled to the current-to-voltage converter, the method comprising:

converting first and second currents of a given PCM cell and complementary PCM cell, respectively, to first and second voltages; and disabling the column decoder and discharging the bitline and complementary bitline voltages based upon the first and second voltages.

16. The method of claim 15, further comprising selectively establishing a connection between the bitline and the complementary bitline during an equalization phase.

17. The method of claim 15, further comprising reading a memory state of a given PCM cell during an evaluation phase.

18. The method of claim 15, further comprising performing a precharge operation and a voltage equalization operation after each read cycle.

19. The method of claim 15, further comprising charging the bitline and complementary bitline to a supply voltage during a precharge phase.

20. The method of claim 16, further comprising generating a detect logic signal that enables switching to the equalization phase.

* * * * *